(12) United States Patent
Skeete et al.

(10) Patent No.: US 9,941,245 B2
(45) Date of Patent: Apr. 10, 2018

(54) INTEGRATED CIRCUIT PACKAGES INCLUDING HIGH DENSITY BUMP-LESS BUILD UP LAYERS AND A LESSER DENSITY CORE OR CORELESS SUBSTRATE

(75) Inventors: Oswald Skeete, Phoenix, AZ (US);
Ravi Mahajan, Chandler, AZ (US);
John Guzek, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 723 days.

(21) Appl. No.: 11/860,922

(22) Filed: Sep. 25, 2007

(65) Prior Publication Data

US 2011/0101491 A1    May 5, 2011

(51) Int. Cl.
*H01L 25/065* (2006.01)
*H01L 23/538* (2006.01)
(Continued)

(52) U.S. Cl.
CPC ...... *H01L 25/0652* (2013.01); *H01L 23/5389* (2013.01); *H01L 25/105* (2013.01);
(Continued)

(58) Field of Classification Search
CPC ... H01L 25/0652; H01L 25/16; H01L 25/105; H01L 23/5389
See application file for complete search history.

(56) References Cited

U.S. PATENT DOCUMENTS 5,761,044 A    6/1998  Nakajima
6,154,366 A   11/2000  Ma et al.
(Continued)

FOREIGN PATENT DOCUMENTS

CN    1470070 A     1/2004
CN    1543675 A    11/2004
(Continued)

OTHER PUBLICATIONS

International Search Report for corresponding matter P26292PCT, dated Feb. 20, 2009.
(Continued)

*Primary Examiner* — Earl Taylor
(74) *Attorney, Agent, or Firm* — Schwegman Lundberg & Woessner, P.A.

(57) ABSTRACT

In some embodiments, integrated circuit packages including high density bump-less build up layers and a lesser density core or coreless substrate are presented. In this regard, an apparatus is introduced having a first element including a microelectronic die having an active surface and at least one side, an encapsulation material adjacent said at least one microelectronic die side, wherein said encapsulation material includes at least one surface substantially planar to said microelectronic die active surface, a first dielectric material layer disposed on at least a portion of said microelectronic die active surface and said encapsulation material surface, a plurality of build-up layers disposed on said first dielectric material layer, and a plurality of conductive traces disposed on said first dielectric material layer and said build-up layers and in electrical contact with said microelectronic die active surface; and a second element coupled to the first element, the second element including a substrate having a plurality of dielectric material layers and conductive traces to conductively couple conductive contacts on a top surface with conductive contacts on a bottom surface, said conductive contacts on said top surface conductively coupled with said conductive traces of said first element. Other embodiments are also disclosed and claimed.

10 Claims, 2 Drawing Sheets

(51) Int. Cl.
*H01L 25/10* (2006.01)
*H01L 25/16* (2006.01)
*H01L 21/56* (2006.01)
*H01L 23/31* (2006.01)
*H01L 23/498* (2006.01)
*H01L 23/00* (2006.01)

(52) U.S. Cl.
CPC ............ *H01L 25/16* (2013.01); *H01L 21/563* (2013.01); *H01L 23/3128* (2013.01); *H01L 23/49827* (2013.01); *H01L 24/13* (2013.01); *H01L 24/16* (2013.01); *H01L 2224/05548* (2013.01); *H01L 2224/05573* (2013.01); *H01L 2225/1023* (2013.01); *H01L 2225/1058* (2013.01); *H01L 2924/00014* (2013.01); *H01L 2924/14* (2013.01); *H01L 2924/1433* (2013.01); *H01L 2924/15174* (2013.01); *H01L 2924/15311* (2013.01); *H01L 2924/18161* (2013.01); *H01L 2924/19041* (2013.01); *H01L 2924/19042* (2013.01); *H01L 2924/19043* (2013.01)

(56) References Cited

U.S. PATENT DOCUMENTS

| | | | |
|---|---|---|---|
| 6,271,469 B1 | 8/2001 | Ma | |
| 6,423,570 B1* | 7/2002 | Ma et al. | 438/106 |
| 6,461,895 B1* | 10/2002 | Liang et al. | 438/107 |
| 6,462,895 B2 | 10/2002 | Hunter | |
| 6,489,185 B1* | 12/2002 | Towle et al. | 438/127 |
| 6,504,242 B1 | 1/2003 | Deppisch et al. | |
| 6,535,388 B1 | 3/2003 | Garcia | |
| 6,555,906 B2* | 4/2003 | Towle et al. | 257/723 |
| 6,586,276 B2 | 7/2003 | Towle | |
| 6,586,822 B1* | 7/2003 | Vu et al. | 257/678 |
| 6,586,836 B1 | 7/2003 | Ma | |
| 6,617,682 B1 | 9/2003 | Ma | |
| 6,706,553 B2* | 3/2004 | Towle et al. | 438/106 |
| 6,709,898 B1 | 3/2004 | Towle | |
| 6,710,444 B2* | 3/2004 | Xie et al. | 257/723 |
| 6,713,859 B1* | 3/2004 | Ma | 257/687 |
| 6,734,534 B1 | 5/2004 | Li | |
| 6,794,223 B2 | 9/2004 | Ma | |
| 6,825,063 B2* | 11/2004 | Vu et al. | 438/106 |
| 6,841,413 B2 | 1/2005 | Liu | |
| 6,888,240 B2 | 5/2005 | Towle | |
| 6,894,399 B2 | 5/2005 | Vu | |
| 6,902,950 B2* | 6/2005 | Ma et al. | 438/106 |
| 6,964,889 B2* | 11/2005 | Ma et al. | 438/127 |
| 6,970,362 B1* | 11/2005 | Chakravorty | 361/782 |
| 7,045,890 B2* | 5/2006 | Xie et al. | 257/706 |
| 7,067,356 B2* | 6/2006 | Towle et al. | 438/122 |
| 7,071,024 B2 | 7/2006 | Towle | |
| 7,078,788 B2 | 7/2006 | Vu et al. | |
| 7,095,108 B2* | 8/2006 | Palanduz | 257/700 |
| 7,102,367 B2* | 9/2006 | Yamagishi et al. | 324/754.07 |
| 7,173,329 B2* | 2/2007 | Frutschy et al. | 257/698 |
| 7,183,658 B2 | 2/2007 | Towle et al. | |
| 7,189,596 B1* | 3/2007 | Mu et al. | 438/110 |
| 7,279,795 B2* | 10/2007 | Periaman et al. | 257/777 |
| 7,288,841 B2* | 10/2007 | Yamano | 257/723 |
| 7,335,608 B2* | 2/2008 | Tanikella | 438/780 |
| 7,335,979 B2* | 2/2008 | Walk | 257/700 |
| 7,371,975 B2* | 5/2008 | Dory et al. | 174/262 |
| 7,391,110 B2* | 6/2008 | Cornelius | 257/724 |
| 7,416,918 B2* | 8/2008 | Ma | 438/106 |
| 7,420,273 B2 | 9/2008 | Liu et al. | |
| 7,446,389 B2* | 11/2008 | Cornelius | 257/532 |
| 7,456,459 B2* | 11/2008 | Wan | 257/296 |
| 7,579,848 B2* | 8/2009 | Bottoms et al. | 324/756.03 |
| 7,594,321 B2* | 9/2009 | Dory et al. | 29/852 |
| 7,613,007 B2* | 11/2009 | Amey et al. | 361/763 |
| 7,714,233 B2* | 5/2010 | Kawamura et al. | 174/260 |
| 7,738,258 B2* | 6/2010 | Ohno et al. | 361/767 |
| 7,741,150 B2* | 6/2010 | Leow et al. | 438/107 |
| 7,749,882 B2* | 7/2010 | Kweon et al. | 438/597 |
| 7,750,248 B2* | 7/2010 | Inui et al. | 174/260 |
| 7,808,797 B2* | 10/2010 | Salama et al. | 361/761 |
| 7,841,076 B2* | 11/2010 | Fujii | 29/832 |
| 7,863,727 B2* | 1/2011 | Lake | 257/698 |
| 7,872,482 B2* | 1/2011 | Chong et al. | 324/754.07 |
| 7,902,660 B1* | 3/2011 | Lee et al. | 257/698 |
| 7,932,471 B2* | 4/2011 | Yamamoto et al. | 174/260 |
| 7,999,383 B2* | 8/2011 | Hollis | 257/758 |
| 8,008,767 B2* | 8/2011 | Wada et al. | 257/687 |
| 2002/0070443 A1* | 6/2002 | Mu et al. | 257/712 |
| 2002/0074641 A1* | 6/2002 | Towle et al. | 257/692 |
| 2002/0127769 A1* | 9/2002 | Ma et al. | 438/106 |
| 2002/0127780 A1* | 9/2002 | Ma et al. | 438/127 |
| 2002/0137263 A1* | 9/2002 | Towle et al. | 438/127 |
| 2003/0068852 A1* | 4/2003 | Towle et al. | 438/200 |
| 2003/0178722 A1* | 9/2003 | Xie et al. | 257/724 |
| 2003/0227077 A1* | 12/2003 | Towle et al. | 257/678 |
| 2004/0094830 A1* | 5/2004 | Vu et al. | 257/678 |
| 2004/0118604 A1* | 6/2004 | Dory et al. | 174/262 |
| 2004/0155352 A1* | 8/2004 | Ma | 257/758 |
| 2005/0136640 A1 | 6/2005 | Hu et al. | |
| 2005/0280137 A1* | 12/2005 | Cornelius | 257/691 |
| 2005/0280145 A1* | 12/2005 | Cornelius | 257/723 |
| 2005/0285255 A1* | 12/2005 | Walk | 257/700 |
| 2005/0287714 A1* | 12/2005 | Walk et al. | 438/127 |
| 2006/0046475 A1* | 3/2006 | Wark et al. | 438/667 |
| 2006/0060956 A1* | 3/2006 | Tanikella | 257/686 |
| 2006/0138591 A1* | 6/2006 | Amey et al. | 257/532 |
| 2006/0138638 A1* | 6/2006 | Komatsu | 257/700 |
| 2006/0163740 A1* | 7/2006 | Ohno et al. | 257/762 |
| 2006/0191711 A1 | 8/2006 | Cho et al. | |
| 2007/0057375 A1* | 3/2007 | Nakamura | 257/758 |
| 2007/0057475 A1 | 3/2007 | Nakamura | |
| 2007/0074900 A1 | 4/2007 | Lee | |
| 2007/0096292 A1* | 5/2007 | Machida | 257/700 |
| 2007/0125575 A1* | 6/2007 | Inui et al. | 174/262 |
| 2007/0152313 A1* | 7/2007 | Periaman et al. | 257/686 |
| 2007/0181992 A1* | 8/2007 | Lake | 257/698 |
| 2007/0245551 A1* | 10/2007 | Yeh | 29/830 |
| 2008/0017971 A1* | 1/2008 | Hollis | 257/698 |
| 2008/0041619 A1* | 2/2008 | Lee et al. | 174/260 |
| 2008/0050901 A1* | 2/2008 | Kweon et al. | 438/597 |
| 2008/0137314 A1* | 6/2008 | Salama et al. | 361/761 |
| 2008/0145622 A1* | 6/2008 | Roy et al. | 428/195.1 |
| 2008/0296697 A1* | 12/2008 | Hsu et al. | 257/379 |
| 2009/0001528 A1* | 1/2009 | Braunisch et al. | 257/659 |
| 2009/0008765 A1* | 1/2009 | Yamano et al. | 257/690 |
| 2009/0072382 A1 | 3/2009 | Guzek | |
| 2009/0079064 A1 | 3/2009 | Tang et al. | |
| 2009/0267212 A1* | 10/2009 | Wada et al. | 257/687 |
| 2011/0101491 A1* | 5/2011 | Skeete et al. | 257/508 |

FOREIGN PATENT DOCUMENTS

| | | |
|---|---|---|
| CN | 101802991 A | 8/2010 |
| CN | 101802991 B | 4/2014 |
| DE | 112008002459 T5 | 11/2010 |
| JP | 08-222690 A | 8/1996 |
| JP | 2003-163323 A | 6/2003 |
| JP | 2003163323 A | 6/2003 |
| JP | 2004-327940 A | 11/2004 |
| JP | 2004327940 A | 11/2004 |
| JP | 2004538619 A | 12/2004 |
| JP | 2006-245574 A | 9/2006 |
| JP | 2006245574 A | 9/2006 |
| JP | 2007503713 A | 2/2007 |
| JP | 2007-103939 A | 4/2007 |
| JP | 2007103939 A | 4/2007 |
| JP | 8222690 A | 8/2012 |
| WO | 02/49103 A2 | 6/2002 |
| WO | WO-0249103 A2 | 6/2002 |
| WO | 2005/020651 A1 | 3/2005 |
| WO | WO-2005020651 A1 | 3/2005 |
| WO | 2009/042463 A1 | 4/2009 |

(56) References Cited

FOREIGN PATENT DOCUMENTS

OTHER PUBLICATIONS

International Preliminary Report on Patentability for corresponding matter P26292PCT, dated Apr. 8, 2010.
Office Action received for German Patent Application No. DE 112008002459.6, dated Jun. 6, 2011, 5 pages.
Office Action received for Korean Patent Application No. 10-2010-7006459, dated May 31, 2011, 5 pages of Korean Office Action including 2 pages of English Translation.
Ma et al.; "Direct Build-Up Layer on an Encapsulated Die Package", U.S. Appl. No. 09/640,961, filed Aug. 16, 2000, 70 pages.
Office Action received for Chinese Patent Application No. 200880106620.6, dated Aug. 2, 2011, 17 pages of Chinese Office Action including 11 pages of English Translation.
Office Action received for Japanese Patent Application No. 2010-523204, dated Sep. 6, 2011, 9 pages of Japanese Office Action including 5 pages of English Translation.
"Chinese Application Serial No. 200880106620.6, Office Action dated Jan. 30, 2013", w/English Translation, 6 pgs.
"Chinese Application Serial No. 200880106620.6, Response filed Jun. 13, 2013 to Office Action dated Jan. 30, 2013", w/English Claims, 10 pgs.
"Japanese Application Serial No. 2010-523204, Examiners Decision of Final Refusal dated Sep. 25, 2012", With English Translation, 7 pgs.
"Japanese Application Serial No. 2010-523204, Office Action dated May 21, 2012", w/English Translation, 10 pgs.
"Taiwanese Application Serial No. 097136112, Statement of Reasons for Re-examination filed Jun. 21, 2013", w/English Claims, 13 pgs.
"Taiwanese Application Serial No. 097136112, Office Action dated May 7, 2013", w/English Translation, 18 pgs.
"Taiwanese Application Serial No. 097136112, Response filed Aug. 17, 2012 to Office Action dated May 16, 2012", 7 pgs.
"Chinese Application Serial No. 200880106620.6, Response filed Dec. 16, 2011 to Office Action dated Aug. 2, 2011", w/English claims, 8 pgs.
"German Application Serial No. 112008002459.6, Office Action dated Jun. 9. 2011", w/English claims, 12 pgs.
"German Application Serial No. 112008002459.6, Response filed Jan. 27, 2012 to Office Action dated Jun. 1, 2011", w/English claims, 21 pgs.
"Japanese Application Serial No. 2010-523204, Office Action dated Sep. 6, 2011", w/English translation, 9 pgs.
"Japanese Application Serial No. 2010-523204, Response filed Jan. 24, 2013 to Office Action dated Sep. 25, 2013", w/English claims, 25 pages.
"Japanese Application Serial No. 2010-523204, Response filed Sep. 13, 2013 to Office Action dated May 21, 2013", w/English claims, 32 pgs.
"Japanese Application Serial No. 2010-523204, Response filed Dec. 20, 2011 to Office Action dated Sep. 6, 2011", w/English claims, 18 pgs.
"Japanese Application Serial No. 2010-523204, Office Action dated Jan. 21, 2014", 11 pgs.
"Taiwanese Application Serial No. 097136112, Office Action dated Jan. 8, 2015", 25 pgs.

\* cited by examiner

INTEGRATED CIRCUIT PACKAGES INCLUDING HIGH DENSITY BUMP-LESS BUILD UP LAYERS AND A LESSER DENSITY CORE OR CORELESS SUBSTRATE

FIELD OF THE INVENTION

Embodiments of the present invention generally relate to the field of integrated circuit package design and, more particularly, to integrated circuit packages including high density bump-less build up layers and a lesser density core or coreless substrate.

BACKGROUND OF THE INVENTION

With shrinking transistor size and more functionality incorporated into microelectronic devices, die to package substrate interconnect geometries will also need to be reduced. Currently, the die is connected to the package substrate using a solder joint connection commonly referred to as a flip-chip connection. Traditional flip chip processes become increasingly complex as bump pitch reduces because of the difficulty in under filling the space between the flip chip bumps.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
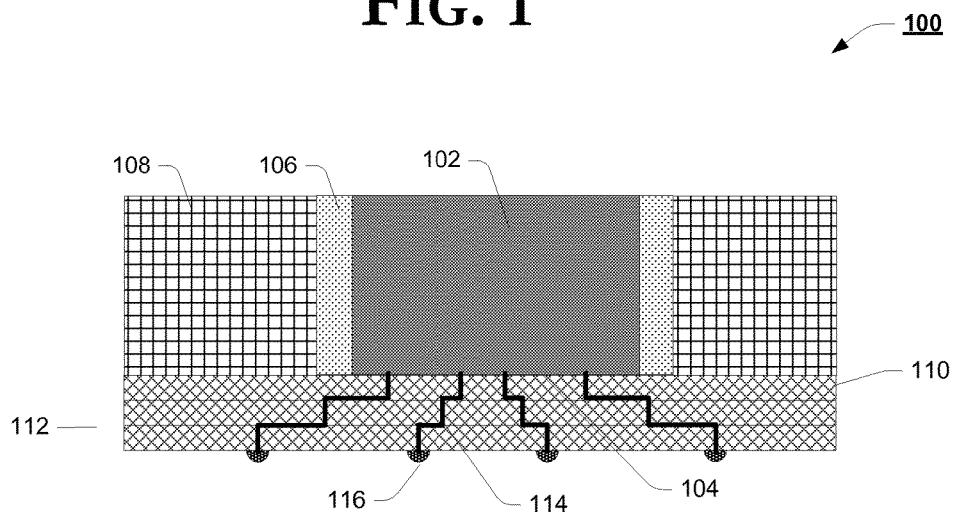
FIG. 1 is a graphical illustration of a cross-sectional view of a first package element including high density bump-less build up layers, in accordance with one example embodiment of the invention.

FIG. 1 is a graphical illustration of a cross-sectional view of a first package element including high density bump-less build up layers, in accordance with one example embodiment of the invention. As shown, first integrated circuit package element 100 includes one or more of microelectronic die 102, microelectronic die active surface 104, encapsulation material 106, microelectronic package core 108, first dielectric material layer 110, build-up layers 112, conductive traces 114, and conductive contacts 116.

Microelectronic die 102 is intended to represent any type of integrated circuit die. In one embodiment, microelectronic die 102 is a multi-core microprocessor. Microelectronic die 102 includes an active surface 104 which contains the electrical connections necessary to operate microelectronic die 102.

Microelectronic die 102 is held in place on at least one side by encapsulation material 106. Encapsulation material 106 includes at least one surface substantially planar to active surface 104. In one embodiment, active surface 104 is placed on a holding plate while encapsulation material 106 is disposed around microelectronic die 102. Encapsulation material 106 may extend over the back side (opposite active surface 104) of microelectronic die 102.

Microelectronic package core 108 may be included in first integrated circuit package element 100 to provide mechanical support and stability during the build-up process. Microelectronic package core 108 may have an opening in which microelectronic die 102 is disposed. In one embodiment microelectronic package core 108 is not included in first integrated circuit package element 100, and encapsulation material 106 may be used to a greater extent.

First dielectric material layer 110 is disposed on at least a portion of active surface 104 and encapsulation material 106. Build-up layers 112 are subsequently disposed on first dielectric material layer 110 using well known processing methods.

Conductive traces 114 are disposed on first dielectric material layer 110 and build-up layers 112 and are in electrical contact with active surface 104. Conductive contacts 116 couple with conductive traces 114 and allow first integrated circuit package element 100 to be electrically coupled, for example by a solder connection, to second integrated circuit package element 200, which is described below. In one embodiment, conductive contacts 116 include solder bumps. In another embodiment, conductive contacts 116 include lands.

Figure 2:
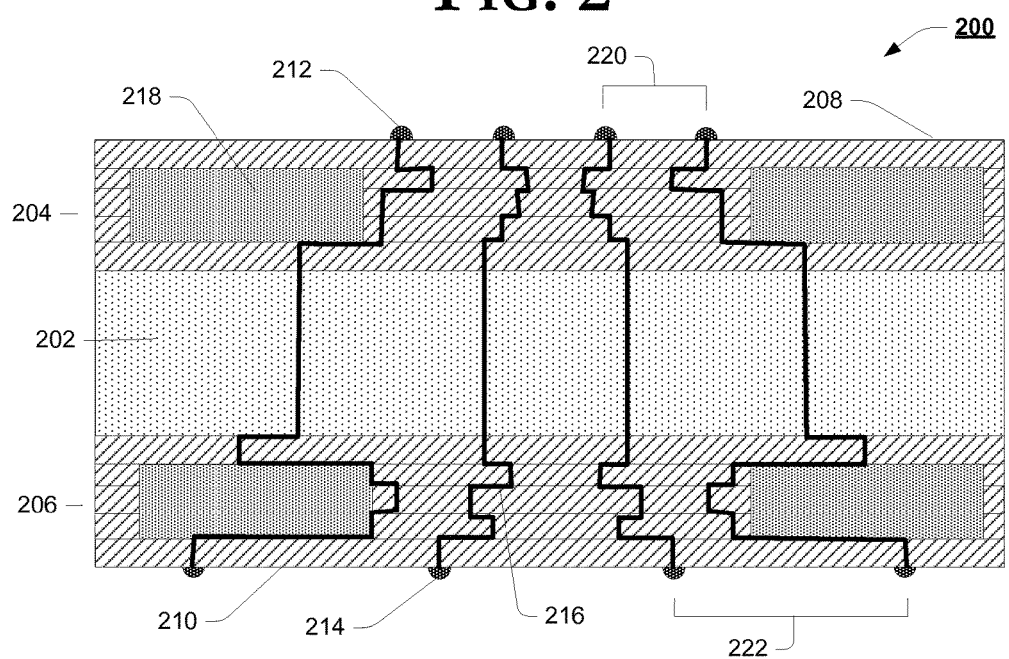
FIG. 2 is a graphical illustration of a cross-sectional view of a second package element including a lesser density core or coreless substrate, in accordance with one example embodiment of the invention.

FIG. 2 is a graphical illustration of a cross-sectional view of a second package element including a lesser density core or coreless substrate, in accordance with one example embodiment of the invention. As shown, second integrated circuit package element 200 includes one or more of substrate core 202, upper build-up layers 204, lower build-up layers 206, top surface 208, bottom surface 210, top conductive contacts 212, bottom conductive contacts 214, conductive traces 216, embedded components 218, top pitch 220, and bottom pitch 222.

Second integrated circuit package element 200 is coupled with first integrated circuit package element 100 to form an integrated circuit package. Second integrated circuit package element 200 may include a substrate core 202 to provide mechanical support. Well known processing methods may be utilized to form upper build-up layers 204 and lower build-up layers 206. In one embodiment, substrate core 202 is not included in second integrated circuit package element 200, and build-up layers alone, for example a multi-layer organic substrate, may be utilized.

Top conductive contacts 212 are disposed on top surface 208. Top conductive contacts 212 allow second integrated circuit package element 200 to be electrically coupled, for example by a solder connection, to first integrated circuit package element 100. In one embodiment, top conductive contacts 212 include solder bumps. In another embodiment, top conductive contacts 212 include lands.

Bottom conductive contacts 214 are disposed on bottom surface 208. Bottom conductive contacts 212 allow second integrated circuit package element 200 to be electrically coupled, for example by a socket connection, to other devices, for example a printed circuit board. In one embodiment, bottom conductive contacts 214 comprise a land grid array. In another embodiment, bottom conductive contacts 214 comprise a ball grid array. In another embodiment, bottom conductive contacts 214 comprise a pin grid array.

Conductive traces 216 are routed through second integrated circuit package element 200 to conductively couple top conductive contacts 212 with bottom conductive contacts 214.

Embedded components 218 may be included in the substrate of second integrated circuit package element 200. In one embodiment, embedded components 218 include at least one memory device. In another embodiment, embedded components 218 include at least one discrete component such as a capacitor, inductor, resistor, logic device or the like.

Second integrated circuit package element 200 is designed to transmit signals from a top pitch 220 to a bottom pitch 222. In one embodiment, top pitch 220 is as fine as practicable to be able to form solder joint connections between first integrated circuit package element 100 and second integrated circuit package element 200. In one embodiment, top pitch 220 is from about 80 to about 130 micrometers. In one embodiment, bottom pitch 222 is from about 400 to about 800 micrometers.

Figure 3:
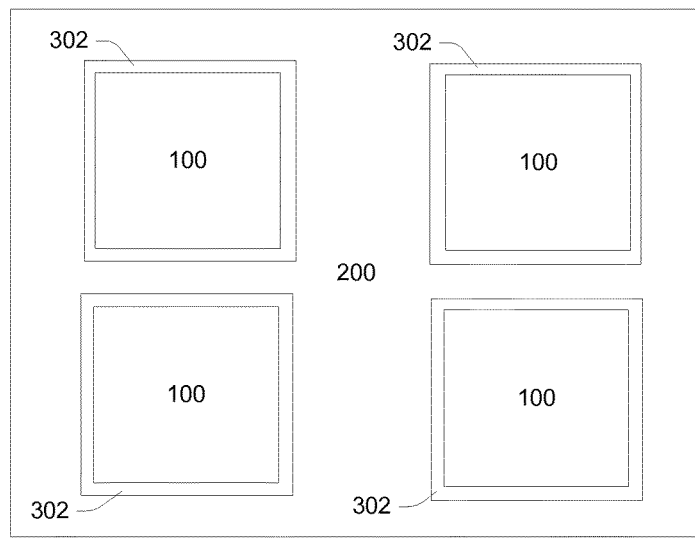
FIG. 3 is a graphical illustration of an overhead view of an integrated circuit package, in accordance with one example embodiment of the invention.

FIG. 3 is a graphical illustration of an overhead view of an integrated circuit package, in accordance with one example embodiment of the invention. As shown, integrated circuit package 300 includes a plurality of first package elements 100 coupled with a second package element 200. While shown as including four first package elements 100, any number may be included. In one embodiment, sixteen first package elements 100 are coupled with a second package element 200. An underfill material 302, such as an epoxy, may be flowed between first elements 100 and second element 200. Underfill material 302 may substantially fill the space between the connections, for example solder joint connections (not shown), between conductive contacts 116 and conductive contacts 212.

Figure 4:
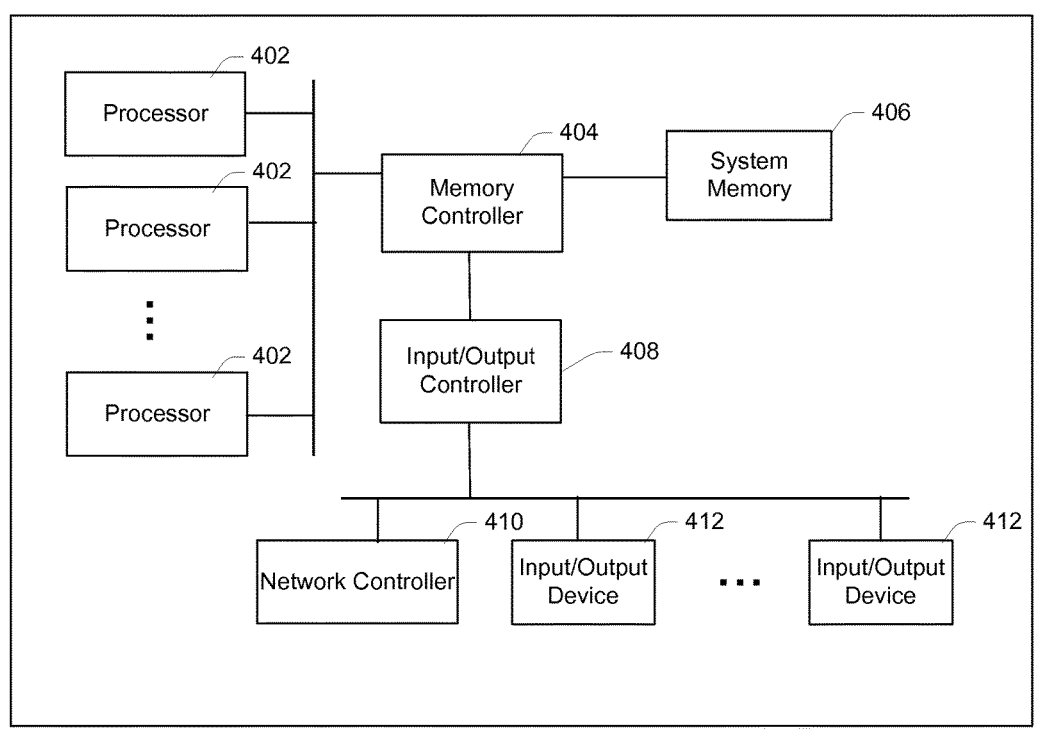
FIG. 4 is a block diagram of an example electronic appliance suitable for implementing an integrated circuit package, in accordance with one example embodiment of the invention.

FIG. 4 is a block diagram of an example electronic appliance suitable for implementing an integrated circuit package, in accordance with one example embodiment of the invention. Electronic appliance 400 is intended to represent any of a wide variety of traditional and non-traditional electronic appliances, laptops, desktops, cell phones, wireless communication subscriber units, wireless communication telephony infrastructure elements, personal digital assistants, set-top boxes, or any electric appliance that would benefit from the teachings of the present invention. In accordance with the illustrated example embodiment, electronic appliance 400 may include one or more of processor(s) 402, memory controller 404, system memory 406, input/output controller 408, network controller 410, and input/output device(s) 412 coupled as shown in FIG. 4. Processor(s) 402, or other integrated circuit components of electronic appliance 400, may comprise a two element package as described previously as an embodiment of the present invention.

Processor(s) 402 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect. In one embodiment, processors(s) 402 are Intel® compatible processors. Processor(s) 402 may have an instruction set containing a plurality of machine level instructions that may be invoked, for example by an application or operating system.

Memory controller 404 may represent any type of chipset or control logic that interfaces system memory 406 with the other components of electronic appliance 400. In one embodiment, the connection between processor(s) 402 and memory controller 404 may be a point-to-point serial link. In another embodiment, memory controller 404 may be referred to as a north bridge.

System memory 406 may represent any type of memory device(s) used to store data and instructions that may have been or will be used by processor(s) 402. Typically, though the invention is not limited in this respect, system memory 406 will consist of dynamic random access memory (DRAM). In one embodiment, system memory 406 may consist of Rambus DRAM (RDRAM). In another embodiment, system memory 406 may consist of double data rate synchronous DRAM (DDRSDRAM).

Input/output (I/O) controller 408 may represent any type of chipset or control logic that interfaces I/O device(s) 412 with the other components of electronic appliance 400. In one embodiment, I/O controller 408 may be referred to as a south bridge. In another embodiment, I/O controller 408 may comply with the Peripheral Component Interconnect (PCI) Express™ Base Specification, Revision 1.0a, PCI Special Interest Group, released Apr. 15, 2003.

Network controller 410 may represent any type of device that allows electronic appliance 400 to communicate with other electronic appliances or devices. In one embodiment, network controller 410 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 410 may be an Ethernet network interface card.

Input/output (I/O) device(s) 412 may represent any type of device, peripheral or component that provides input to or processes output from electronic appliance 400.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. An apparatus comprising:
a plurality of first elements each including:
- a microelectronic die having an active surface and at least one side,
- an encapsulation material adjacent said at least one microelectronic die side, wherein said encapsulation material includes at least one surface substantially planar to said microelectronic die active surface,
- a substrate forming a direct ace with the active surface and the encapsulation material, the substrate including:
- a first dielectric material layer forming a substantially continuous, direct interface with at least a portion of said microelectronic die active surface and said encapsulation material surface,
- a plurality of build-up layers disposed on said first dielectric material layer,
- a plurality of conductive traces disposed on said first dielectric material layer and said build-up layers and in electrical contact with said microelectronic die active surface;
- a second element coupled to said plurality of first elements, the second element including a substrate having a core, and a plurality of dielectric material layers and conductive traces built up on either side of the core, to conductively couple conductive contacts on a top surface with conductive contacts on a bottom surface, said conductive contacts on said top surface conductively coupled with said conductive traces of said plurality of first elements;
- at least one memory device embedded within the plurality of dielectric material layers built up on at least one side of the core of the second component; and
- a printed circuit board coupled to the conductive contacts on the bottom surface of the second element, the second element having the plurality of first elements coupled to the top surface of the second element.

2. The apparatus of claim 1, wherein said plurality of first elements comprises four first elements.

3. The apparatus of claim 1, wherein said plurality of first elements comprises sixteen first elements.

4. The apparatus of claim 1, wherein said conductive contacts on said top surface of said second element comprise a pitch of from about 80 to about 130 micrometers.

5. The apparatus of claim 1, wherein said conductive contacts on said bottom surface of said second element comprise a pitch of from about 400 to about 800 micrometers.

6. The apparatus of claim 1, further comprising said plurality of first elements including a microelectronic package core having an opening in which said microelectronic die is disposed.

7. The apparatus of claim 1, wherein said conductive contacts on said bottom surface of said second element comprise a land grid array.

8. The apparatus of claim 1, wherein said conductive contacts on said bottom surface of said second element comprise a ball grid array.

9. The apparatus of claim 1, wherein said conductive contacts on said top surface of said second element comprise bumps.

10. The apparatus of claim 1, further comprising epoxy underfill between said plurality of first elements and said second element.

* * * * *

UNITED STATES PATENT AND TRADEMARK OFFICE
CERTIFICATE OF CORRECTION

PATENT NO. : 9,941,245 B2  
APPLICATION NO. : 11/860922  
DATED : April 10, 2018  
INVENTOR(S) : Skeete et al.

Page 1 of 1

It is certified that error appears in the above-identified patent and that said Letters Patent is hereby corrected as shown below:

In the Claims

In Column 5, Line 13, in Claim 1, delete "ace" and insert --interface-- therefor Signed and Sealed this  
Fifth Day of January, 2021

Andrei Iancu  
*Director of the United States Patent and Trademark Office*